US007911013B2

(12) United States Patent
Wise (10) Patent No.: US 7,911,013 B2
(45) Date of Patent: Mar. 22, 2011

(54) SPACE AND PROCESS EFFICIENT MRAM

(75) Inventor: Loren J. Wise, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 21 days.

(21) Appl. No.: 12/557,726

(22) Filed: Sep. 11, 2009

(65) Prior Publication Data

US 2010/0002497 A1   Jan. 7, 2010

Related U.S. Application Data

(62) Division of application No. 11/736,272, filed on Apr. 17, 2007, now Pat. No. 7,629,182.

(51) Int. Cl.
*H01L 29/82* (2006.01)

(52) U.S. Cl. ............... 257/421; 257/295; 257/E21.665; 257/E29.323; 365/158; 365/171

(58) Field of Classification Search .................. None
See application file for complete search history.

(56) References Cited

U.S. PATENT DOCUMENTS

| | | | |
|---|---|---|---|
| 6,664,579 B2 * | 12/2003 | Kim et al. | 257/296 |
| 6,714,444 B2 | 3/2004 | Huai et al. | |
| 6,744,086 B2 | 6/2004 | Daughton et al. | |
| 7,031,183 B2 | 4/2006 | Kerszykowski et al. | |
| 7,149,106 B2 | 12/2006 | Mancoff et al. | |
| 2004/0061156 A1 * | 4/2004 | Cha | 257/295 |
| 2005/0009212 A1 | 1/2005 | Grynkewich et al. | |
| 2005/0191764 A1 | 9/2005 | Yates et al. | |
| 2006/0087880 A1 | 4/2006 | Mancoff et al. | |
| 2006/0138502 A1 | 6/2006 | Sugahara et al. | |

FOREIGN PATENT DOCUMENTS

WO    2004072978 A2    8/2004

OTHER PUBLICATIONS

Sugahara, S. et al., "Spin MOSFET Using Ferromagnetic Schottky Barrier Contacts", 0-7803-9040-7/05/ 2005 IEEE, p. 211-212.

* cited by examiner

Primary Examiner — Charles D Garber
Assistant Examiner — Yasser A Abdelaziez
(74) Attorney, Agent, or Firm — Ingrassia Fisher & Lorenz, P.C.

(57) ABSTRACT

Embodiments of a magnetoresistive random access memory (MRAM) array include multiple transistors having source and drain regions, and multiple substantially planar MRAM bits. The MRAM bits have upper and lower electrodes and intervening magnetics layers. The lower electrodes of at least some of the MRAM bits are formed substantially directly on at least some of the source or drain regions without an intervening via. Embodiments of an MRAM array also include a first conductive interconnect layer above and in electrical contact with the upper electrodes of at least some of the MRAM bits, with no metal layers intervening between the upper electrodes and the first conductive interconnect layer.

20 Claims, 7 Drawing Sheets

SPACE AND PROCESS EFFICIENT MRAM

RELATED APPLICATION

This application is a divisional of U.S. patent application Ser. No. 11/736,272.

TECHNICAL FIELD

The present invention generally relates to electronic devices, and more particularly to electronic devices and methods incorporating magnetoresistive random access memory (MRAM) bits and associated drive and sense circuitry.

BACKGROUND

Figure 1:
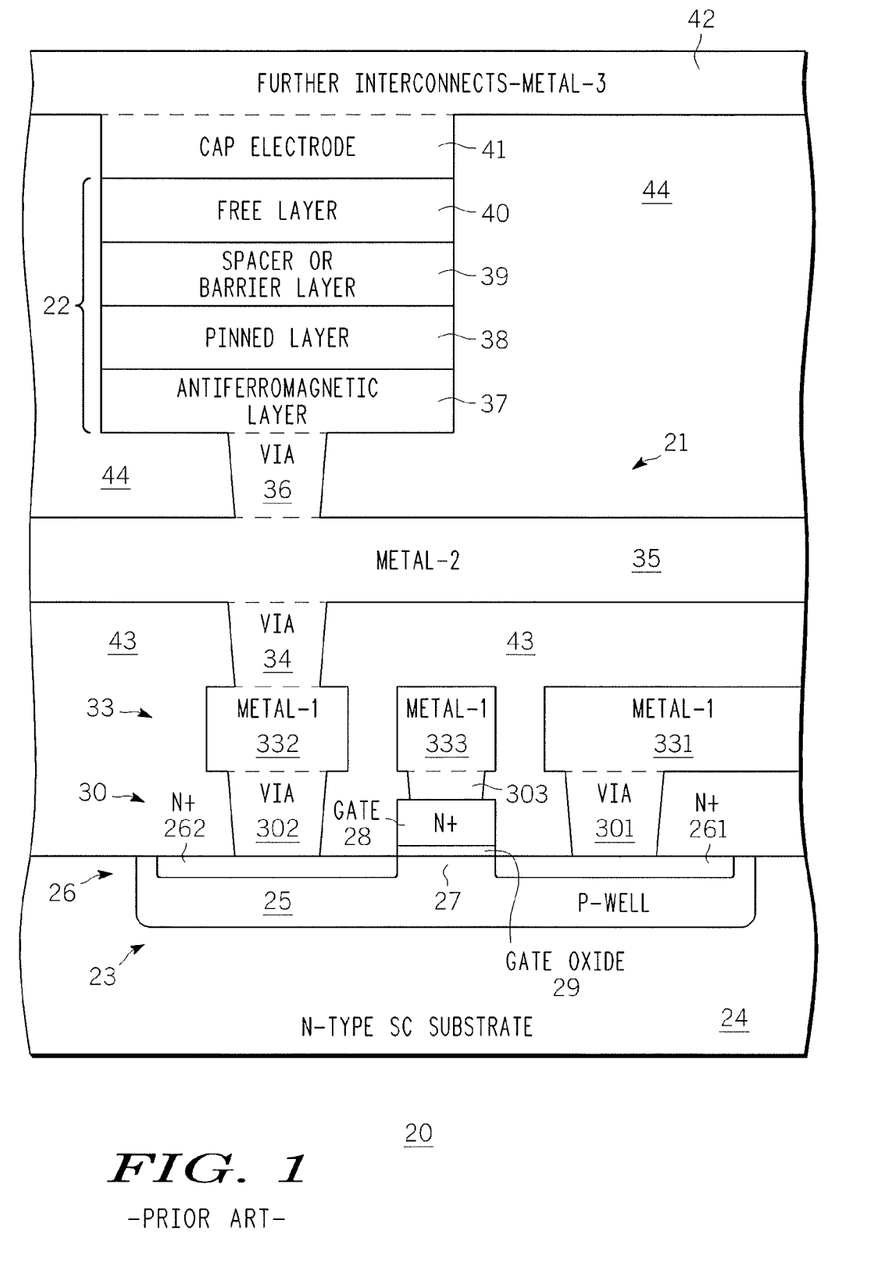
FIG. 1 is a simplified schematic cross-sectional view of a magnetoresistive random access memory (MRAM) bit integrated with at least one drive/sense transistor on a common substrate, according to the prior art.

Magnetoresistive random access memory (MRAM) devices are well known in the art and come in a variety of forms. To achieve large integrated MRAM arrays, the individual MRAM bits and their associated sense and drive transistors and circuitry should be formed on a common substrate. FIG. 1 shows a simplified schematic cross-sectional view of memory device 20 comprising magnetoresistive random access memory (MRAM) bit 22 integrated with at least one drive/sense transistor 23 on common N-type semiconductor (SC) substrate 24 (e.g., silicon), according to the prior art. Transistor 23 has P-well region 25 in which are formed N+ source and drain regions 26. For convenience of description, it is assumed that N+ region 262 functions as a source and N+ region 261 functions as a drain. Control gate 28 overlies gate dielectric (e.g., silicon oxide) 29 above channel region 27 between source 262 and drain 261. Conductive vias 301, 302, 303 (collectively 30) couple source and drain regions 26 and gate 28 to portions 331, 332, 333 of conductor 33, also referred to as "metal-1", that is, source region 262 to portion 332, drain region 261 to portion 331 and gate 28 to portion 333. Conductive via 34 couples portion 332 of metal-1 33 to second conductor 35, also referred to as "metal-2". Metal-1 33 and metal-2 35 are supported by dielectric 43. Conductive via 36 couples metal-2 35 to MRAM bit 22. MRAM bit 22 comprises, for example, antiferromagnet layer 37 in contact with via 36 and surmounted successively by pinned layer 38, spacer or barrier layer 39 and free magnetic layer 40. Non-magnetic conductive cap electrode 41 is provided on free magnetic layer 40. Non-magnetic conductive cap electrode 41 is in turn coupled to further interconnect layer 42 also referred to as "metal-3". Spacer or barrier layer 39 may be either a non-magnetic conductive spacer layer, in which case MRAM bit 22 is referred to as a "spin valve" (SV) device, or a thin tunneling dielectric layer, in which case MRAM bit 22 is referred to as "spin tunnel junction" (STJ) device. MRAM bit 22 and metal-3 42 are supported by dielectric 44. Either composition of layer 39 is useful, and the present invention does not depend upon the exact nature of MRAM bit 22. For convenience of description it is assumed that spin momentum transfer is used to program MRAM bit 22 and that layer 39 is a dielectric tunneling layer, but this is not intended to be limiting. Such structures and programming mode are well known in the art.

It is often the case that the materials and processes needed to form an array of MRAM bits 22 are different than the materials and processes needed to form the array of associated drive/sense transistors (e.g., multiple transistors 23) and circuitry (e.g., vias 30, metal-1 33, vias 34, metal-2 35, various connections to gates 28, etc.), collectively referred to as the "drive/sense circuits" 21.

It has been customary in the past to form the MRAM devices after the associated drive/sense circuits 21 have been completed. This gives rise to at least two important problems that can have a significant negative affect on the cost of integrated MRAM arrays. First, the number of manufacturing steps needed to form the prior art integrated MRAM array is approximately equal to the total number of steps to individually form the associated drive/sense transistors and circuits, plus the steps needed to form the MRAM bits and their interconnections. Since the manufacturing cost and yield is proportional to the number of manufacturing steps and their complexity, it is advantageous to make the manufacturing process more efficient by reducing the number of manufacturing steps needed to form the combination of drive/sense circuits and MRAM bits. Second, the historic approach of building the MRAM bits separately from the drive/sense circuits 21 also tends to increase the total chip area occupied by the MRAM array, thereby also increasing the unit cost of such arrays since there are fewer die per wafer. Thus, prior art MRAM arrays are said to also be space inefficient. Accordingly there is an ongoing need for more space and process efficient structures and methods in which MRAM bits are more closely integrated with their associated drive/sense devices and circuits.

Accordingly, it is desirable to provide more space and process efficient structures and methods for forming the MRAM bits and associated drive/sense circuits. In addition, it is desirable that the improved structures and methods be simple, rugged and reliable, and further, that the MRAM bits included therein be formed in a manner compatible with semiconductor device and integrated circuit structures on the same substrate. It is further desirable that the improved MRAM structures and method reduce the number of required process steps and more fully integrate the MRAM bits with the associated drive/sense devices and circuits in order to more efficiently use the available chip area and thereby further improve the manufacturing yield and reduce the cost. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The invention will hereinafter be described in conjunction with the following drawing figures, wherein like numerals denote like elements.

FIGS. 13-16 are simplified schematic cross-sectional views of an MRAM bit and an associated drive/sense transis-

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

Figure 2:
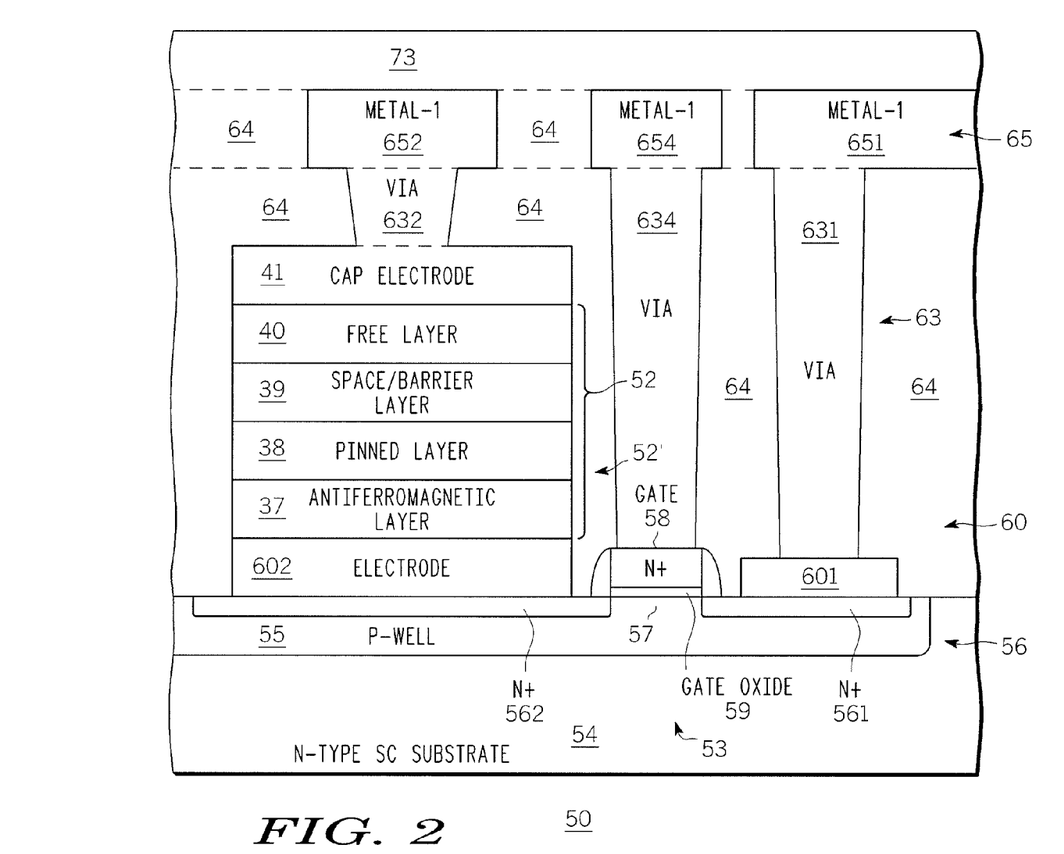
FIG. 2 is a simplified schematic cross-sectional view of a magnetoresistive random access memory (MRAM) bit integrated with at least one drive/sense transistor on a common substrate, according to an embodiment of the invention.

FIG. 2 shows a simplified schematic cross-sectional view of memory device 50 comprising magnetoresistive random access memory (MRAM) bit 52 integrated with drive/sense transistor 53 on common semiconductor (SC) substrate 54 (e.g., silicon), according to an embodiment of the invention. Memory device 50 of FIG. 2 is illustrated as including transistor 53 that can function as a drive (write) transistor or as a sense (read) transistor, according to the needs of the overall memory design. For convenience of explanation, SC substrate 54 is assumed to be N-type and well region 55 therein is assumed to be P-type, so that transistor 53 is an N-channel device, but this is not intended to be limiting. Persons of skill in the art will understand that transistor 53 can be either N-type or P-type by appropriate choice of the dopants for the various regions. For the case where substrate 54 is N-type, transistor 53 has P-well region 55 in which are formed N+ source and drain regions 56. For convenience of description, it is assumed that N+ region 562 functions as a source and N+ region 561 functions as a drain, but this is not essential and their roles may be interchanged. For the purposes of this invention it does not matter which region functions as the source and which as the drain. Accordingly, region 562 is also referred to herein as source/drain region 562 and region 561 as drain/source 561 and collectively as source/drain regions 56. Control gate 58 overlies gate dielectric (e.g., silicon oxide) 59 above channel region 57 between drain/source region 561 and source/drain region 562. Gate dielectric 59 may be any insulating material. Control gate 58 may be formed from any conductive material. Doped poly-silicon is preferred but not essential.

Device 50 of FIG. 2 differs from device 20 of FIG. 1 in that MRAM bit 52 (with electrode 602) is located directly on source/drain region 562 of drive/sense transistor 53. Bottom electrode region 602 is desirable to ensure good ohmic contact to source/drain region 562, but is not essential. When included it is considered to be a part of MRAM bit 52. Contact region 601 of the same or equivalent material may also be provided on drain/source region 561 for the same reasons. Silicide placed in contact with source/drain regions 562 and drain/source region 561 also helps ensure good ohmic contact, and is a preferred material for electrodes 601, 602 (collectively 60) when used in conjunction with a silicon substrate, but other conductive materials may also be used with silicon and other semiconductor substrates.

Conductive vias 631, 634, (collectively 63) couple drain/source region 561 and gate 58 to portions 651, 654, of conductor 65, respectively, also referred to as "metal-1", that is, drain/source region 561 is coupled by via 631 to portion 651 of metal-1 65, and gate 58 is coupled by via 634 to portion 654 of metal-1 65. Metal-1 65 is supported by dielectric 64. Passivation or interlayer dielectric 73 is desirably but not essentially provided covering metal-1 65. Additional layers of interconnect may be placed above metal-1, but are not shown. MRAM bit 52 has in this example, the same composition and internal arrangement as MRAM bit 22 of FIG. 1, but is located differently and formed in a manner so as to be more fully integrated with drive/sense transistor 53. MRAM bit 52 comprises, for example and not intended to be limiting, antiferromagnet layer 37 on non-magnetic electrode 602 and surmounted by pinned layer 38, spacer or barrier layer 39 and free magnetic layer 40. Non-magnetic conductive cap electrode 41 is desirably provided on free magnetic layer 40 for ease of electrical coupling thereto. As noted previously, either composition of layer 39 is useful and the present invention does not depend upon the exact nature of MRAM bit 52. For convenience of description it is assumed that spin momentum transfer is used to program MRAM bit 52. This programming mode is well known in the art. Further, any of the various layers described in the prior art for the construction of MRAM bits may be used in MRAM bit 52 of the embodiment illustrated in FIG. 2 (as well as in the embodiments illustrated in FIGS. 3-16).

It will be noted that that MRAM bit 52 is formed in the immediate proximity of and/or in contact with source/drain region 562 of drive/sense transistor 53. This is unlike MRAM device 20 of prior art FIG. 1, wherein MRAM bit 22 is more remotely coupled to source/drain region 262 by means of several vias (e.g., 302, 34, 36) and multiple metal layers (e.g., metal-1 33 and metal-2 35). For example, in FIG. 2, by placing antiferromagnetic layer 37 (or equivalent) of MRAM bit 52 with electrode 602 in contact with source/drain region 562, most of the above-noted prior art vias and metal layers can be eliminated or freed to use for other purposes. In FIG. 2 only one via 632 is used to couple MRAM bit 52 to portion 652 of Metal-1 65, but this is not essential. Depending upon the material of cap electrode 41, portion 652 of metal-1 65 may be coupled directly to cap electrode 41 and via 632 may also be eliminated. Thus, the arrangement illustrated in FIG.

2 substantially reduces the complexity of MRAM device 50 compared to prior art MRAM device 20 of FIG. 1. The numbers of vias and layers required to form device 50 of FIG. 2 are significantly less than the numbers of vias and layers needed for device 20 of FIG. 1. The number of process steps is reduced by the numbers of vias and conductor and dielectric layers that are eliminated. Thus, device 50 is more process efficient than prior art device 20. Further, locating MRAM bit 52 over and in substantially direct contact with corresponding source/drain region 562 (or drain/source region 561) of drive/sense transistor 53 without intervening vias or displaced or off-set conductor layers, allows an overall more compact layout for device 50 compared to device 20, thereby making the invented embodiment more space-efficient than prior art device 20.

FIGS. 3-8 are simplified schematic cross-sectional views of MRAM bit stack 166-1 (see FIGS. 6-8) and associated drive/sense transistor 141 at different stages 100-105 of manufacture, according to further embodiments of the invention and showing further details. Structures 120-125 result from manufacturing stages 100-105, respectively. Referring now to manufacturing stage 100 of FIG. 3, transistor 141 comprises semiconductor substrate 140 of a first conductivity type, either P or N type, in which are formed spaced-apart doped region 142-1 and 142-2 (collectively 142) of a second, opposite conductivity type, e.g., either N or P type, relatively heavily doped compared to substrate 140, and extending to surface 149 of substrate 140. Doped regions 142-1 and 142-2 are adapted to act as source and/or drain regions. For convenience of description, regions 142 are collectively referred to as source/drain regions 142. Region 142-2 is also referred to as being a "source/drain" region and region 142-1 is also referred to as a "drain/source" region to indicate that if one of these regions acts as the source, the other region will act as the drain. Persons of skill in the art will understand that regions 142-1, 142-2 may perform either function, depending upon the overall memory design.

Figure 3:
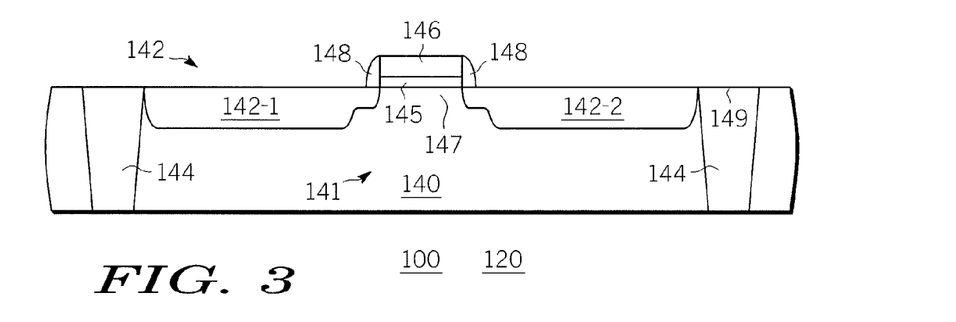
FIGS. 3-8 are simplified schematic cross-sectional views of an MRAM bit and an associated drive/sense transistor at different stages of manufacture, according to further embodiments of the invention and showing further details.

Ion implantation is a preferred method for forming source/drain regions 142, but any other doping process may also be used. Substrate 140 may be single crystal or polycrystalline, or a layer or region within a larger substrate or part of a layered structure such as for example and not intended to be limiting a semiconductor-on-insulator (SOI) structure. Any convenient semiconductor material may be used for substrate 140, such as for example and not intended to be limiting, types IV, III-V and II-VI materials and combinations thereof as well as organic and other semiconductor materials. As used herein, the term "semiconductor" and the abbreviation "SC" is intended to include these and other variations. Any SC may be conveniently used depending upon the processes and materials available to the designer. Isolation walls 144 of, for example and not intended to be limiting, silicon oxide or other dielectric, are conveniently provided laterally outside source/drain regions 142. Etch and refill is a well-known method for providing isolation walls 144, but any convenient isolation process may also be used. Channel region 147 between source/drain regions 142 is covered by gate dielectric 145 (e.g., of silicon oxide or other insulating material) above which is located gate 146. Any conductive material may be used for gate 146. Doped polysilicon is a convenient material for forming gate 146, but many other well known conductors can also be used. As used herein, the term "polysilicon" is intended to include such variations. Dielectric sidewall spacers 148 are conveniently provided covering the lateral edges of gate 146, using well known techniques. Structure 120 results. Transistor 141 of structure 120 is a conventional transistor structure that can be manufactured using various well known semiconductor device fabrication processes, and the exact steps and materials used for forming transistor 141 are not material to the present invention. For convenience of description it is assumed henceforth that substrate 140 is P-type silicon, or is a P-type well in a more complex substrate. As used herein, the word "substrate" is intended to include these and other variations. With P-type substrate 140, source/drain regions 142 are N+ regions so that resulting transistor 141 is an N-channel device, but this is not essential and not intended to be limiting. In these circumstances, doped polysilicon is a preferred material for gate 146. It will be understood by those of skill in the art that arrays of transistors 141 of either or both conductivity types are formed on a common substrate along with the associated MRAM bits, to form an integrated MRAM array. While transistor 141 is illustrated herein as being an insulated gate field effect transistor (which is preferred), this is not essential and transistor 141 may be any type of transistor, as for example and not intended to be limiting, a bipolar transistor or a junction field effect transistor, etc., in which case, references herein and in the claims that follow to source/drain regions are intended to refer to the principal current carrying terminals of such other transistors.

Figure 4:
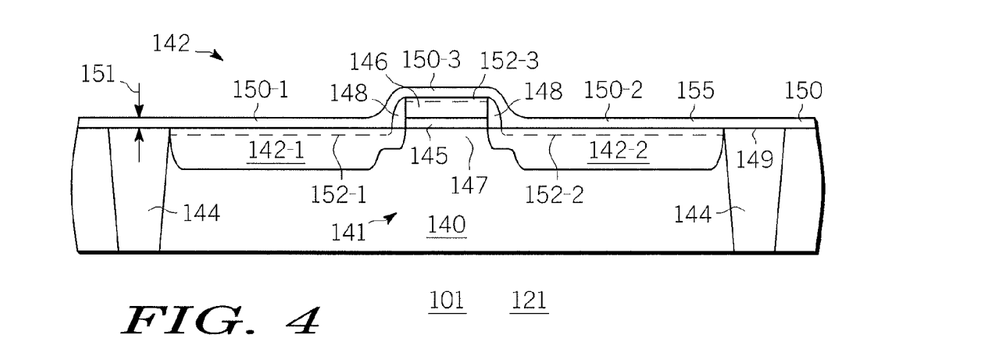

In manufacturing stage 101 of FIG. 4, transistor 141 of structure 120 of FIG. 3 is conveniently covered by highly conductive material layer 150 that is adapted to alloy with the semiconductor material of substrate 140 in source/drain regions 142 and to gate 146 to form low resistance ohmic contacts thereon. Layer 150 conveniently has thickness 151 in the range of about 25 to 500 Angstrom Units, preferably about 100 to 250 Angstroms Units, but thinner and thicker layers can also be used. Layer 150 has outer surface 155. Ti, TiN, Co, Ni, Pt, W and/or silicides of such materials are examples of suitable conductors for forming layer 150. Means for depositing such materials are well known in the art. It is desirable to heat substrate 140 homogeneously or locally so that the material of layer 150 alloys with the underlying semiconductor, as indicated by alloy regions 152-1, 152-2, 152-3 underlying regions 150-1, 150-2, 150-3, respectively, but this is not essential, provided that good ohmic contact is made to regions 142 and 146, respectively. After such heat treatment, layer 150 may be removed or left in place. For convenience of description it is assumed for manufacturing stages 102-105 that layer 150 is left in place. Structure 121 results.

Figure 5:
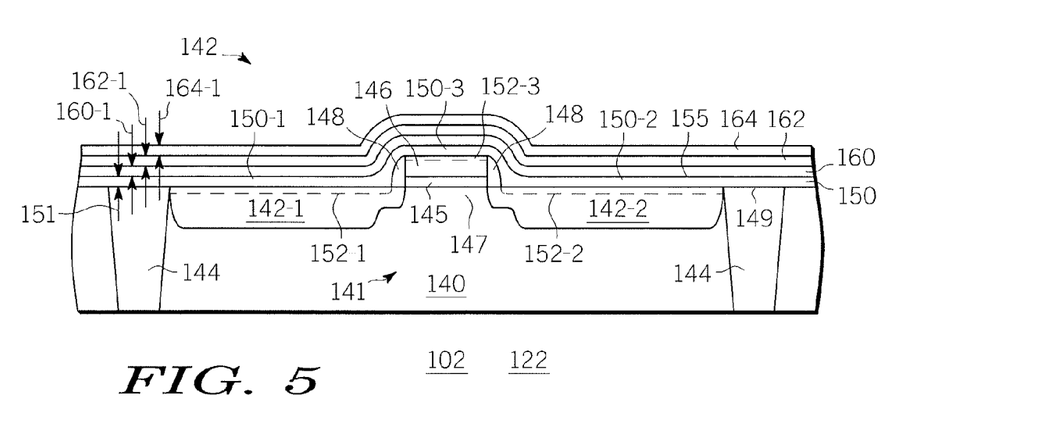

Referring now to manufacturing stage 102 of FIG. 5, blanket layers 160, 162, 164 are deposited or otherwise formed on surface 155 of layer 150 of transistor 141. Layer 160 is generally a non-magnetic conductive layer analogous to electrode layer 602 of FIG. 2, and forms the bottom electrode underlying magnetics layer 162 that represents the sandwich of layers need to form MRAM bit 52 of FIG. 2. Upper layer 164 is generally a non-magnetic conductive material analogous to cap electrode 41 of FIG. 2. Lower electrode layer 160 is desirably formed from TaN, Ta, W, or combinations thereof and has thickness 160-1 in the range of about 200 to 1000 Angstrom Units, preferably about 400 to 500 Angstrom Units. Upper electrode or cap layer 164 is desirably formed from TaN, Ta or combinations thereof and has thickness 164-1 in the range of about 200 to 1500 Angstrom Units, preferably about 500 to 1000 Angstrom Units. Magnetics layer 162 may be a simple stack comprising, for example and not intended to be limiting, antiferromagnetic layer 37 (e.g., of PtMn), pinned layer 38 (e.g., of CoFe, CoFeB, Ru, or combinations thereof), barrier layer 39 (e.g., of $Al_2O_3$, MgO, or combinations thereof), and free layer 40 (e.g., of CoFeB) such as are shown in FIGS. 1-2. Thickness 162-1 of these particular layers will depend upon the materials chosen therefore. Such MRAM bit structures are well known in the art and have many variations. For example and not intended to be limiting, magnetics layer 162 may comprise other materials and layers adapted to form synthetic anti-ferromagnetic (AFM) layers, depending upon the desired properties of the MRAM bit. Accordingly, magnetics layer 162 is intended to represent any combination of layers desired for the MRAM bit and is not intended to be limited just to the particular layer structure illustrated in FIG. 2 for MRAM bit 52. While reference number 52 is intended to refer to the combination of magnetics layers illustrated in FIG. 2 (e.g., layers 37-40), the designation 52' is intended to refer not only to the particular magnetics layers illustrated in FIG. 2, but also to the various other combinations of magnetic and non-magnetic layers (including but not limited to AFM layers) that can be used to form MRAM bits. Thus, the words "MRAM bit 52'" and "magnetics layer 162" are intended to include any combination of magnetic and non-magnetic layers adapted to form an MRAM bit, and the invention described herein is not intended to be limited merely to the particular combinations of magnetic and non-magnetic layers illustrated herein for the MRAM bit. Structure 122 results from manufacturing stage 102.

Figure 6:
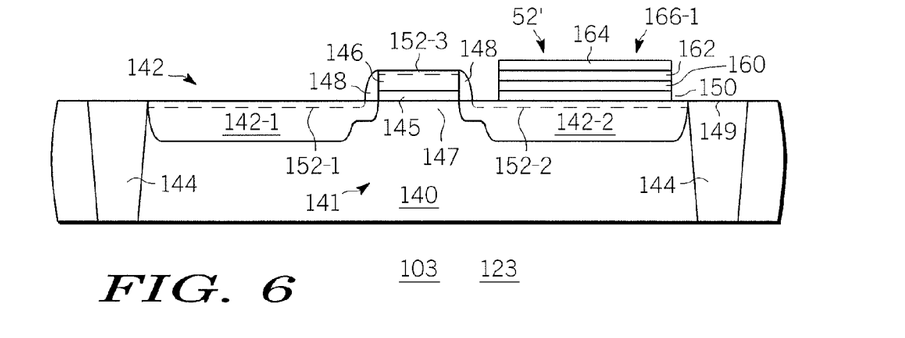
Figure 7:
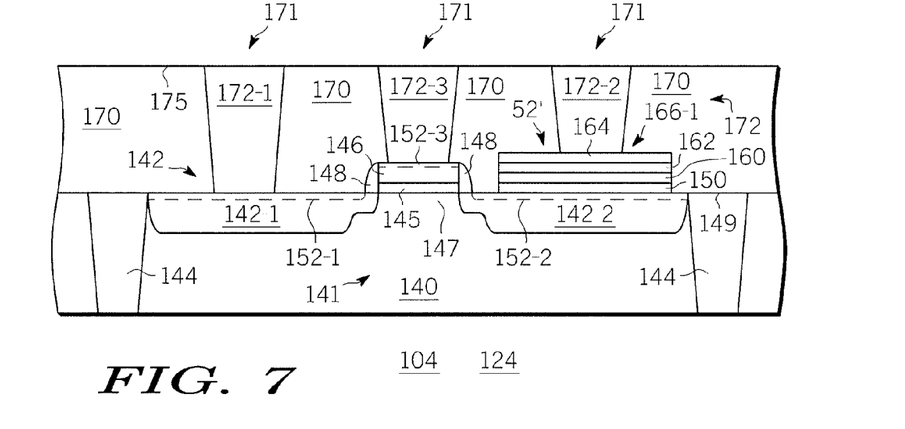

Referring now to manufacturing stage 103 of FIG. 6, structure 122 of FIG. 5 is masked and etched to define MRAM bit stack 166-1 comprising layers 150, 160, 162, 164 in contact with ohmic contact region 152-2 of doped source or drain region 142-2 (hereafter source/drain region 142, since stack 166-1 can be placed on either of regions 142-1 or 142-2). Structure 123 results. Referring now to manufacturing stage 104 of FIG. 7, structure 123 of FIG. 6 is desirably covered by dielectric layer 170 and cavities 171 etched therein. Conductive vias 172 are formed in cavities 171 so that via 172-1 is coupled to ohmic contract region 152-1 of drain/source region 142-1, via 172-2 is coupled to upper electrode 164 of MRAM bit stack 166-1 and via 172-3 is coupled to ohmic contact region 152-3 of gate 146. It is desirable that upper surface 175 of dielectric 170 and vias 172 be planarized, but this is not essential. Structure 124 results. Referring now to manufacturing stage 105 of FIG. 8, structure 124 of FIG. 7 has metal-1 layer 180 formed on surface 175, masked and etched to provide separated interconnect portion 180-1 coupled to via 172-1, interconnect portion 180-2 coupled to via 172-2 and interconnect portion 180-3 coupled to via 172-3. Dielectric regions 182-1 and 182-2 (collectively 182) are desirably formed between interconnect portions 180-1 and 180-3, and between and 180-2 and 180-3, respectively. Structure 125 results. Surface 185 is desirably planarized and a further dielectric passivation layer (not shown) and further interconnect layers (not shown) may be applied above surface 185, but these are not essential to the invention and depend generally on what other devices and interconnections may be required to produce the overall integrated MRAM structure or other integrated circuit. Structure 125 is analogous to MRAM device 50 of FIG. 2.

Figure 8:
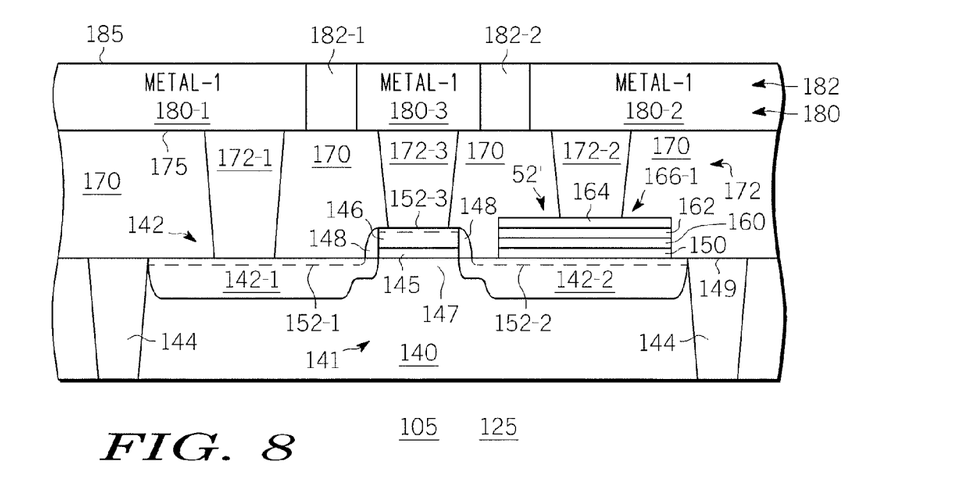

The number of process steps needed to form structure 125 of FIG. 8 is significantly less than the number of process steps needed to form MRAM device 20 of FIG. 1 because several vias and metal layers have been eliminated. Thus, the manufacturing method illustrated in manufacturing stages 100-105 is more process efficient than that required to form device 20 of FIG. 1. Further the arrangement of MRAM bit 52' comprising bit stack 166-1 directly above and substantially in contact with source/drain region 142 makes for a compact geometry, thus reducing the area that need be occupied in order to connect MRAM bit stack 166-1 and MRAM bit 52' to transistor 141. Thus, the invented device and method illustrated in the embodiment of FIGS. 3-8 are more space efficient as well as more process efficient. Only one layer of interconnect need be used instead of three layers of interconnects as in the prior art.

Figure 9:
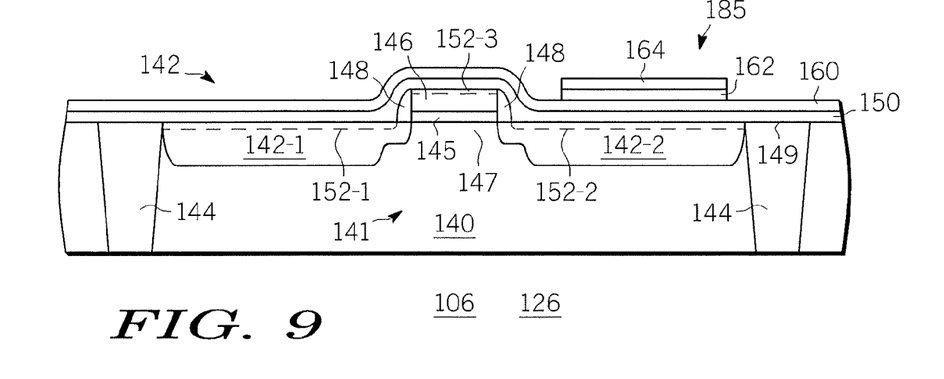
FIGS. 9-12 are simplified schematic cross-sectional views of an MRAM bit and an associated drive/sense transistor at different stages of manufacture, according to still further embodiments of the invention and showing further details.
Figure 10:
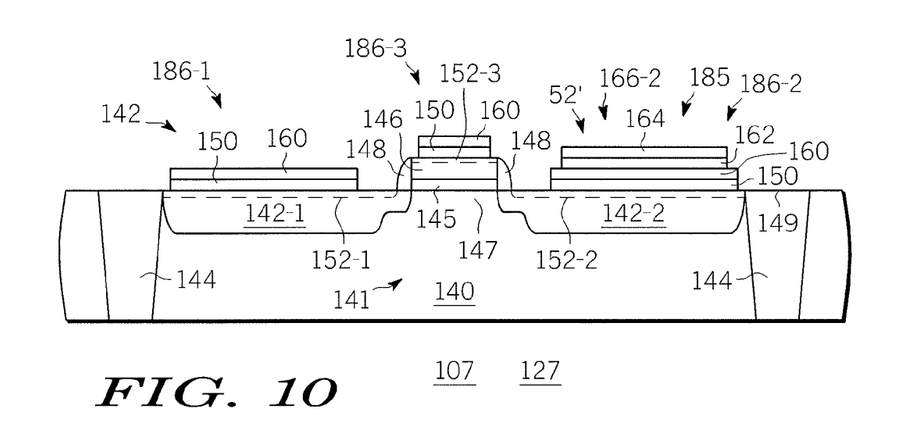
Figure 11:
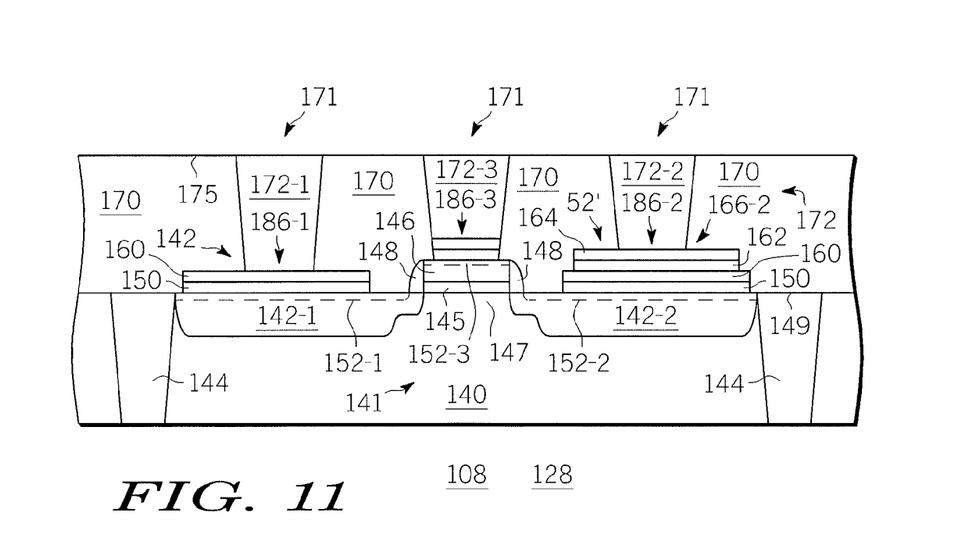
Figure 12:
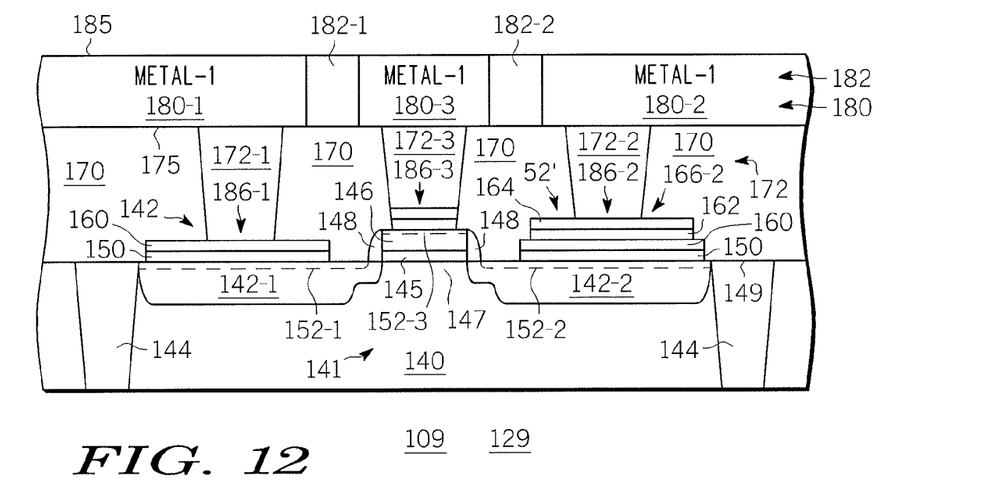

FIGS. 9-12 are simplified schematic cross-sectional views of MRAM bit stack 166-2 (see FIG. 10) and associated drive/sense transistor 141 at different stages 106-109 of manufacture, according to still further embodiments of the invention and showing further details. Structures 126-129 result from manufacturing stages 106-109, respectively. Manufacturing stage 106 of FIG. 9 is preceded by manufacturing stages 100-102 of FIGS. 3-5. In manufacturing stage 106, structure 122 of FIG. 5 is masked and etched to remove all but portion 185 of layers 162, 164. Structure 126 results. Structure 126 can be achieved by taking advantage of the differential etching characteristics of the materials of layer 164 and 162 compared to layer 160. The etch process may or may not leave a residue of layer 162 across the surface at this stage depending on the properties of the etch process. Such differential etching processes are well known in the art. Referring now to manufacturing stage 107 of FIG. 10, a second masking and etching operation is performed to remove all but portion 186-2 of layers 160 and 150 over region 152-2, portion 186-1 over region 152-1 and portion 186-3 over region 152-3, thereby forming MRAM bit stack 166-2 of MRAM bit 52' and providing low resistance contacts to drain/source region 142-1 and gate 146. Structure 127 results. Manufacturing stages 108 of FIG. 11 and 109 of FIG. 12 are analogous to manufacturing stages 104 of FIG. 7 and 105 of FIG. 8 and the discussion thereof is included by reference. Structures 128 and 129 result from the combination of manufacturing stages 108 and 109. The difference is in the shape and extent of MRAM bit stack 166-2 versus MRAM bit stack 166-1 (and the provision of low resistance contacts to drain/source region 142-1 and gate 146), brought about by use of a two-mask etching process in manufacturing stages 106-107 compared to a one-mask etching process of manufacturing stage 103. Providing portions 186-1 and 186-3 is desirable but not essential.

Figure 13:
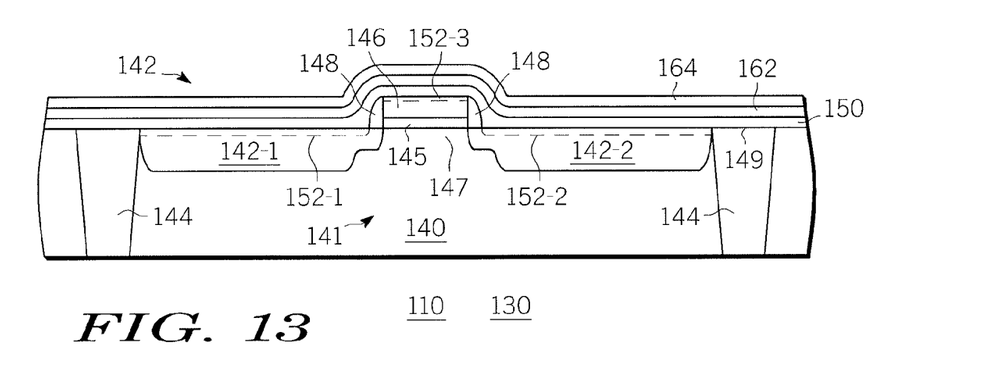
Figure 14:
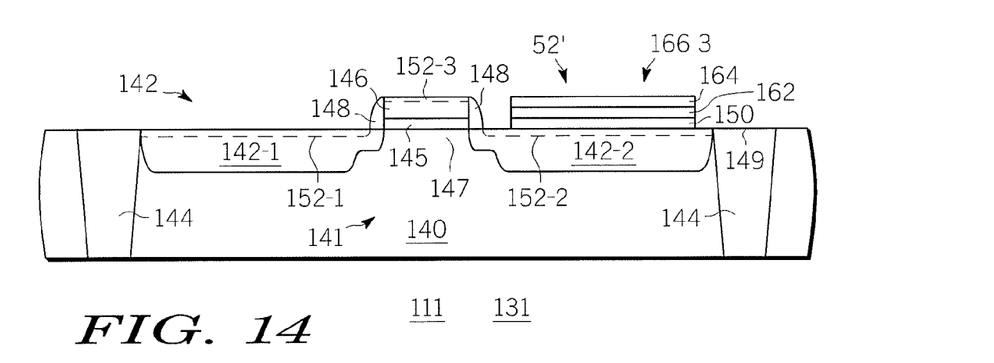
Figure 15:
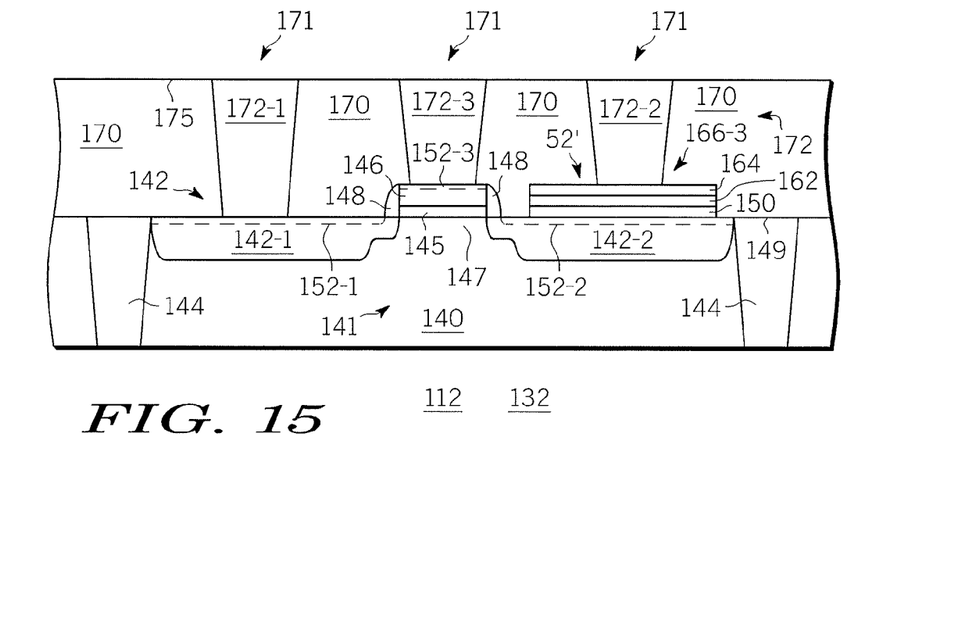
Figure 16:
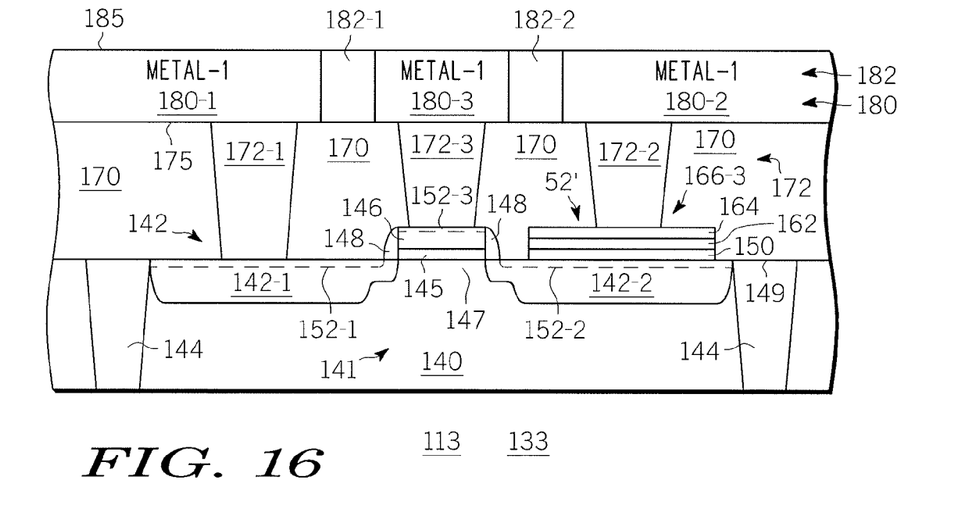

FIGS. 13-16 are simplified schematic cross-sectional views of MRAM bit stack 166-3 and associated drive/sense transistor 141 at different stages 110-113 of manufacture, according to yet further embodiments of the invention and showing further details. Structures 130-133 result from manufacturing stages 110-113, respectively. Manufacturing stage 110 of FIG. 13 is preceded by manufacturing stages 100, 101 and 102 of FIGS. 3-5 with layer 160 omitted from manufacturing stage 102 of FIG. 5. The discussion of manufacturing stages 100, 101 and 102 is incorporated herein by reference, with the exception that layer 160 is omitted. In manufacturing stage 102 of FIG. 5, layers 162, 164 are deposited or formed directly on any remaining portions of layer 150 or on ohmic contract silicide region 152 of source/drain regions 142, thereby producing structure 130. In manufacturing stage 111 of FIG. 14, structure 130 of manufacturing stage 110 is masked and etched to define MRAM bit stack 166-3, using well known masking and etching processes. Structure 131 results. Manufacturing stages 112 of FIG. 15 and 113 of FIG. 16 are analogous to manufacturing stages 104 of FIG. 7 and 105 of FIG. 8 and the discussion thereof is included by reference. Structure 133 results from the combination of manufacturing stages 112 and 113. The difference is in the omission of electrode layer 160 of MRAM bit stack 166-3 versus MRAM bit stack 166-1. This further simplifies the manufacturing process. The process illustrated in FIGS. 3 through 7 is preferred. Layer 150 is shown as remaining in FIGS. 13-16, but persons of skill in the art will understand that it may no longer be separately identifiable, having been wholly or partly consumed in forming silicide contact regions 152. Material deposited to form the silicide contact regions may or may not be etched away after the silicide is formed. Either arrangement is useful.

If the surface between source/drain region 142-2 and isolation region 144 (or other adjacent regions) is irregular, i.e., substantially non-planar, it is desirable that the lateral dimensions of source/drain region 142-2 be such that MRAM bit 52' (e.g., stacks 166-1 of FIG. 6, 166-2 of FIG. 12 or 166-3 of FIG. 16) lies substantially entirely laterally within source/drain region 142-2, but this is not essential. If a larger MRAM bit or smaller source/drain region is desired, one or more of the lateral dimensions of MRAM bit 52' can exceed the lateral dimensions of source/drain region 142-2. In this situation, it is desirable that the surface on which MRAM bit 52' rests be substantially smooth compared to the thickness of the layers making up MRAM bit 52', that is, without abrupt changes in elevation profile by an amount significant compared to the thickness of the overlying layers. Otherwise, the electrical integrity of the magnetic bit may be adversely affected. Gradual changes in the elevation profile are generally tolerable, that is, changes in the elevation profile over lateral distances at least equal to the change in elevation. This degree of smoothness can be provide is a variety of ways well known in the art, as for example and not intended to be limiting, by careful attention to the process steps for forming regions 142, 149, 152, etc., and/or by providing a planarization step prior to forming MRAM bit 52'. Either approach is useful. Accordingly, the present invention is not limited merely to arrangements wherein MRAM bit 52' lies entirely laterally within the relevant source/drain region. There is no specific limit to the amount by which the lateral dimensions of the relevant bit stack or MRAM bit can exceed the lateral dimensions of the source/drain region on which it rests. However, it is important that the contact resistance between the bit stack and the underlying source/drain region be small compared to the resistance of the magnetic bit itself, so as to not significantly degrade the ability of a circuit to detect a change in magnetic bit resistance as a function of its magnetic orientation. In general, it is desirable that the contact area between the bit stack and its underlying source/drain region be such that the contact resistance between the bit stack and the underlying source/drain region is one tenth or less of the resistance of the magnetic bit stack itself.

The manufacturing stages illustrated in FIGS. 7-8, 11-12 and 15-16 make use of vias 172 for coupling the various device regions to metal-1 180. This is preferred because it provides planar surfaces 175 and 185 on which further dielectric and interconnect layers may be formed to the extent they are needed for other parts of the overall integrated MRAM array or overall integrated circuit. However, if such further dielectric and interconnect layers are not needed then vias 172 may be eliminated and metal-1 itself may be used to directly contact the various device regions otherwise contacted by vias 172, thus further simplifying the manufacturing process.

According to a first embodiment, there is provided a method for forming an array of magnetoresistive random access memory (MRAM) bits and associated drive or sense transistors, comprising, forming at least one drive or sense transistor having a source or drain region, and forming at least one MRAM bit in substantially direct contact with the source or drain region without an intervening via. In a further embodiment, the MRAM bit has a lateral shape lying substantially within a lateral shape of the source or drain region with which it makes substantially direct contact. In a still further embodiment, the step of forming the at least one MRAM bit comprises, forming the at least one MRAM bit in substantially direct contact with the source or drain region by means of an intervening non-magnetic contact electrode layer. In a yet further embodiment, the method further comprises forming a first conductive interconnect layer above and in electrical contact with the at least one MRAM bit. In a still yet further embodiment, the first conductive interconnect layer has spaced-apart portions, a first portion coupled to the transistor and a second portion coupled to the MRAM bit. In a yet still further embodiment, the step of forming the at least one MRAM bit comprises, forming an antiferromagnetic layer electrically coupled to the source or drain region of the at least one drive or sense transistor without a via, forming a magnetically pinned layer on the antiferromagnetic layer, forming a barrier or spacer layer on the magnetic pinned layer, and forming a magnetic free layer on the spacer or barrier layer. In an additional embodiment, the step of forming the at least one MRAM bit further comprises, forming an upper non-magnetic cap electrode in electrical contact with the magnetic free layer. In a yet additional embodiment, the method further comprises forming a first overlying conductive interconnect layer electrically connected to the non-magnetic cap electrode. In a still additional embodiment, the step of forming at least one MRAM bit further comprises, forming a lower non-magnetic contact electrode between the antiferromagnetic layer and the source or drain of the at least one drive or sense transistor.

According to a second embodiment, there is provided a magnetoresistive random access memory (MRAM) array comprising, multiple transistors having source and drain regions, multiple substantially planar MRAM bits having upper and lower electrodes and intervening magnetics layers, and wherein the lower electrodes of at least some of the MRAM bits are formed substantially directly on at least some of the source or drain regions. According to a further embodiment, lower electrodes of the at least some of the MRAM bits have first lateral perimeters and the at least some of the source or drain regions on which such MRAM bits are directly formed have second lateral perimeters, such that each first lateral perimeter lies substantially within a second lateral perimeter. According to a still further embodiment, the lower electrodes are formed substantially on the at least some of the source or drain regions without an intervening conductive via. According to a yet further embodiment, the array further comprises other elements and a first conductive interconnect layer, wherein the first conductive interconnect layer overlies the upper electrode of the MRAM bits and couples the upper electrodes of the MRAM bits and at least some of the source or drain regions not coupled to the lower electrodes of the MRAM bits, to the other elements of the array. According to a yet still further embodiment, the MRAM bits have a first resistance in a first magnetic state and a second resistance in a second magnetic state, and the lower electrodes of the at least some of the MRAM bits formed in substantially direct contact with the at least some of the source or drain regions have a contact resistance that is one-tenth or less of the first or second resistance.

According to a third embodiment there is provided a method for forming a magnetoresistive random access memory (MRAM) array, comprising, providing a substrate having therein multiple transistors, each with first and second principal current carrying electrodes and at least one control electrode, extending to a first surface, forming on first current carrying principal electrodes of some of the multiple transistors, magnetoresistive random access memory (MRAM) bits having upper and lower electrodes, wherein said lower electrodes are substantially in direct contact with the first current carrying principal electrodes, and forming above the MRAM bits a conductive first interconnect layer adapted to couple the upper electrodes of the MRAM bits and at least some of the second current carrying electrodes of the multiple transistors to other elements of the MRAM array. According to a further embodiment, the step of forming the MRAM bits comprises forming the MRAM bits on the first principal current carrying electrodes of some of the multiple transistors without an intervening conductive via. According to a still further embodiment, the lower electrodes of the MRAM bits are a non-magnetic electrically conductive material. According to a yet further embodiment, the lower electrodes of the MRAM bits are a magnetic electrically conductive material. According to a still yet further embodiment, the step of forming the MRAM bits on the first current carrying principal electrodes comprises, depositing multiple substantially continuous layers of materials making up the MRAM bits and then etching such layers of materials to laterally define the MRAM bits substantially in direct contact with the first current carrying electrodes of the some of the multiple transistors. According to a yet still further embodiment, the first principal current carrying electrodes have a first perimeter and the MRAM bits have a second perimeter smaller than the first perimeter.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof. In particular, a great many variation may be made in the composition and numbers of the various layers making up MRAM bit 52, 52', magnetics layer 162 and bit stacks 166-1, 166-2, 166-3, etc. The present invention does not depend upon the exact composition of MRAM bit 52, 52', magnetics layer 162 and bit stacks 166-1, 166-2, 166-3, etc., and it is intended that all such variations are included within the claims that follow. What is important is that MRAM bit 52, 52' and/or bit stacks 166-1, 166-2, 166-3, etc., be located substantially in direct contact with the source/drain region of their associated transistors without vias (although contact electrodes may be present) so as to lie between metal-1 and the contact surface of the underlying transistor(s). It is this arrangement and associated method that provides the advantages of improved process and layout efficiency, and therefore higher yield and lower manufacturing cost.

What is claimed is:

1. A magnetoresistive random access memory (MRAM) array comprising:
   multiple transistors having source and drain regions;
   multiple substantially planar MRAM bits having upper and lower electrodes and intervening magnetics layers, wherein the lower electrodes of at least some of the MRAM bits are formed substantially directly on at least some of the source or drain regions without an intervening via; and
   a first conductive interconnect layer above and in electrical contact with the upper electrodes of at least some of the MRAM bits, with no metal layers intervening between the upper electrodes and the first conductive interconnect layer.

2. The MRAM array of claim 1, wherein lower electrodes of the at least some of the MRAM bits have first lateral perimeters and the at least some of the source or drain regions on which such MRAM bits are directly formed have second lateral perimeters, such that each first lateral perimeter lies substantially within a second lateral perimeter.

3. The MRAM array of claim 1, wherein the first conductive interconnect layer couples the upper electrodes of the MRAM bits and at least some of the source or drain regions not coupled to the lower electrodes of the MRAM bits, to the other elements of the array.

4. The MRAM array of claim 1, wherein the MRAM bits have a first resistance in a first magnetic state and a second resistance in a second magnetic state, and the lower electrodes of the at least some of the MRAM bits formed in substantially direct contact with the at least some of the source or drain regions have a contact resistance that is one-tenth or less of the first or second resistance.

5. The MRAM array of claim 1, wherein the intervening magnetics layers comprise a magnetically pinned layer, a barrier or spacer layer, and a magnetically free layer.

6. The MRAM array of claim 5, further comprising:
   an antiferromagnetic layer electrically coupled to the lower electrodes of at least some of the MRAM bits, wherein the magnetically pinned layer is formed on the antiferromagnetic layer, the barrier or spacer layer is formed on the magnetic pinned layer, and the magnetic free layer is formed on the barrier or spacer layer.

7. The MRAM array of claim 1, wherein the lower electrodes of at least some of the MRAM bits have width dimensions that are at least as wide as width dimensions of the intervening magnetics layers.

8. A magnetoresistive random access memory (MRAM) array comprising:
   at least one drive or sense transistor having a source or drain region;
   a plurality of layers for at least one MRAM bit in direct contact with and overlying the at least one drive or sense transistor, including overlying the source or drain region, without an intervening via between the source or drain region and the plurality of layers, wherein the plurality of layers includes an electrode layer, a magnetically pinned layer, a barrier or spacer layer, and a magnetically free layer, and wherein the electrode layer is in direct contact with the source or drain region and has a width dimension that is at least as wide as width dimensions of the magnetically pinned layer, the barrier or spacer layer, and the magnetically free layer; and
   a first conductive interconnect layer above and in electrical contact with the plurality of layers for the at least one MRAM bit, with no metal layers intervening between the plurality of layers and the first conductive interconnect layer.

9. The MRAM array of claim 8, wherein the MRAM bit has a lateral shape lying substantially within a lateral shape of the source or drain region with which it makes substantially direct contact.

10. The MRAM array of claim 8, wherein the first conductive interconnect layer has spaced-apart portions, a first portion coupled to the transistor and a second portion coupled to the MRAM bit.

11. The MRAM array of claim 8, further comprising:
   an antiferromagnetic layer electrically coupled to the electrode layer, wherein the magnetically pinned layer is formed on the antiferromagnetic layer, the barrier or spacer layer is formed on the magnetic pinned layer, and the magnetic free layer is formed on the barrier or spacer layer.

12. The MRAM array of claim 11, further comprising:
an upper non-magnetic cap electrode in electrical contact with the magnetic free layer.

13. The MRAM array of claim 8, wherein the MRAM bit has a first resistance in a first magnetic state and a second resistance in a second magnetic state, and the electrode layer of the MRAM bit has a contact resistance that is one-tenth or less of the first or second resistance.

14. A magnetoresistive random access memory (MRAM) array comprising:
at least one drive or sense transistor having a source or drain region;
a non-magnetic contact electrode layer of at least one MRAM bit overlying and in direct contact with the at least one drive or sense transistor, including overlying the source or drain region, and without an intervening via between the source or drain region and the at least one drive or sense transistor;
a plurality of additional layers of the at least one MRAM bit in direct contact with the non-magnetic contact electrode layer, wherein the plurality of additional layers includes a magnetically pinned layer, a barrier or spacer layer, and a magnetically free layer, and wherein the electrode layer has a width dimension that is at least as wide as width dimensions of the magnetically pinned layer, the barrier or spacer layer, and the magnetically free layer; and
a first conductive interconnect layer above and in electrical contact with the plurality of additional layers for the at least one MRAM bit, with no metal layers intervening between the plurality of additional layers and the first conductive interconnect layer.

15. The MRAM array of claim 14, wherein the MRAM bit has a lateral shape lying substantially within a lateral shape of the source or drain region.

16. The MRAM array of claim 14, further comprising:
a via above and in electrical contact with the at least one MRAM bit and the first conductive interconnect layer.

17. The MRAM array of claim 14, further comprising:
an antiferromagnetic layer electrically coupled to the non-magnetic contact electrode layer without a via, wherein the magnetically pinned layer is formed on the antiferromagnetic layer, the barrier or spacer layer is formed on the magnetic pinned layer, and the magnetic free layer is formed on the spacer or barrier layer.

18. The MRAM array of claim 17, further comprising:
an upper non-magnetic cap electrode in electrical contact with the magnetic free layer.

19. The MRAM array of claim 14, wherein the first conductive interconnect layer has spaced-apart portions, a first portion coupled to the transistor and a second portion coupled to the MRAM bit.

20. The MRAM array of claim 14, wherein the MRAM bit has a first resistance in a first magnetic state and a second resistance in a second magnetic state, and the electrode layer of the MRAM bit has a contact resistance that is one-tenth or less of the first or second resistance.

* * * * *